United States Patent [19]

Iwasaki et al.

[11] Patent Number: 5,323,534
[45] Date of Patent: Jun. 28, 1994

[54] PROCESS FOR PRODUCING COAXIAL CONDUCTOR INTERCONNECTION WIRING BOARD

[75] Inventors: Yorio Iwasaki; Toshiro Okamura, both of Shimodate; Shigeharu Arike, Tochigi; Yasushi Shimada, Tsukuba; Hiroharu Kamiyama, Shimodate; Eisaku Namai, Shimodate; Fujio Kojima, Shimodate, all of Japan

[73] Assignee: Hitachi, Ltd., Tokyo, Japan

[21] Appl. No.: 27,803

[22] Filed: Mar. 8, 1993

Related U.S. Application Data

[62] Division of Ser. No. 735,266, Jul. 24, 1991, Pat. No. 5,233,133.

[30] Foreign Application Priority Data

Jul. 25, 1990 [JP] Japan ................. 2-196904
May 20, 1991 [JP] Japan ................. 3-114297

[51] Int. Cl.$^5$ ............................. H01K 3/10
[52] U.S. Cl. ........................ 29/850; 174/251; 174/255
[58] Field of Search ............ 29/850, 830, 896; 174/251, 255

[56] References Cited

U.S. PATENT DOCUMENTS

| | | | |
|---|---|---|---|
| 4,646,436 | 3/1987 | Crowel | 174/251 |
| 4,679,321 | 7/1987 | Plonski | 174/251 |
| 4,743,710 | 10/1988 | Shieber et al. | 174/250 |
| 4,797,787 | 1/1989 | Jorgensen | 361/402 |
| 4,899,439 | 2/1990 | Potter et al. | 174/255 |

FOREIGN PATENT DOCUMENTS

| | | |
|---|---|---|
| 219628 | 3/1987 | European Pat. Off. . |
| 219815 | 4/1987 | European Pat. Off. . |
| 2096834 | 10/1982 | United Kingdom . |

Primary Examiner—Carl J. Arbes
Attorney, Agent, or Firm—Antonelli, Terry, Stout & Kraus

[57] ABSTRACT

A coaxial conductor interconnection wiring board characterized by having at least one inner wall metallized conductive hole for connecting a conductive shield of coaxial conductor to a ground layer, or having connection metal layers for connecting ground layers or connecting the conductive shield to a ground layer, and an inner wall metallized conductive hole for connecting a central signal conductor of coaxial conductor to other circuits, is excellent in preventing crosstalk noise and shielding effect.

6 Claims, 8 Drawing Sheets

PROCESS FOR PRODUCING COAXIAL CONDUCTOR INTERCONNECTION WIRING BOARD

This is a division of application Ser. No. 07/735,266, filed Jul. 24, 1991 now U.S. Pat. No. 5,233,133 issued Aug. 3, 1993.

BACKGROUND OF THE INVENTION

This invention relates to a coaxial conductor interconnection wiring board and a process for producing the same.

With the development of electronic devices, wiring boards having a very high wiring density have been required. As such wiring boards having a very high wiring density, there are known wiring boards using wires as a necessary wiring pattern (hereinafter referred to as "multi-wire wiring board", e.g. Japanese Patent Examined Publication No. 45-21434) and multi-layer printed wiring boards. In highly densified wiring boards, the crosstalk noise among neighboring wires or signal conductor lines becomes an important problem. In order to solve such a problem, there are proposed various processes for shielding wiring boards, for example, a process for making signal conductor lines and a grounding pattern by build-up method (Japanese Patent Examined Publication No. 58-54520), a process for using an electroconductive coating film as a shield (Japanese Patent Unexamines Publication No. 51-71961), a process for providing a conductive shield surrounding insulated wire conductors by plating method (U.S. Pat. No. 4,646,436), etc. But these processes are insufficient for solving the problem of crosstalk noise.

On the other hand, in order to improve these shielding processes, there are proposed processes for using a so-called coaxial conductor covered with a conductive shield on an outer insulating layer surrounding a signal conductor (U.S. Pat. Nos. 4,679,321 and 4,743,710). When such coaxial conductors are used, connections of a central signal conductor and a conductive shield of the coaxial conductor with other conductors become a problem. According to U.S. Pat. No. 4,743,710, there are proposed two processes. According to a first process (shown in FIGS. 1A to 1E of said U.S. Patent), it is necessary to remove an electroconductive substance, and a conductive shield and insulation of the coaxial conductor using a focussed laser at a portion to be connected, while retaining only a central signal conductor. But when the laser energy is made small so as not to remove the central signal conductor of coaxial conductor, removal of the portions to be removed cannot be carried out completely. In contrast, when the laser energy is made large so as to remove the portions to be removed completely, the central signal conductor is also vaporized or damaged. Thus, it is difficult to determine conditions satisfying both requirements and to maintain such a laser energy constantly. Further, according to the description at lines 58 to 67 on column 3 of said U.S. Patent, the central signal conductor reflects the $CO_2$ laser energy and other organic materials can be removed. But since the organic ground layer (here, an electroconductive paste is imaged) has high electroconductivity, the shielding effect becomes small. According to a second process (shown in FIGS. 2A to 2F of said U.S. Patent), it is necessary to etch back selectively the conductive shield of coaxial conductor exposed to an inner wall of hole. In order to attain such a selective etch back, it is necessary to use different materials for the conductive shield and the central signal conductor of the coaxial conductor. Further, this means that it is difficult to insulate the inner portion of hole including the selectively etched back portion and a surface of the ground layer. When different materials are used for the conductive shield and the central signal conductor of coaxial conductor, the decay of signal of central signal conductor becomes larger in the case of using a poor electroconductive material for the central signal conductor of coaxial conductor, while the shielding effect becomes smaller in the reverse case. Further, when the conductive shield of coaxial conductor is selectively etched back, very small vacant spaces are formed in the etched back portions. It is difficult to fill such vacant spaces with a resin solution, and even if filled with the resin solution, generation of undesirable voids is inevitable due to vaporization of a solvent contained in the resin solution.

SUMMARY OF THE INVENTION

It is an object of the present invention to provide a coaxial conductor interconnection wiring board without crosstalk noise, excellent in shielding effect and suitable for high speed signal management, and a process for producing the same.

The present invention provides a coaxial conductor interconnection wiring board comprising a circuit substrate (2') having a ground layer (1), or an insulating substrate (2) formed on a ground layer (1), an adhesive insulating layer (3) formed on said circuit substrate (2') or said insulating substrate (2), at least one coaxial conductor (4) fixed on the surface of said adhesive insulating layer (3) with a desired shape, an insulating layer (11) covering said coaxial conductor (4), and at least one conductive hole (8), inner wall of which is covered with a metal layer connected to a center signal conductor (7) of said coaxial conductor (4), connection of a conductive shield (5) of said coaxial conductor (4) to said ground layer (1) being obtained by at least one inner wall metallized conductive hole (6) or connection metal layers (6'), and connection of said center signal conductor (7) to said inner wall metallized conductive hole (8) being obtained by using said coaxial conductor from which a part of conductive shield (5) has been selectively removed.

The present invention also provides a process for producing the coaxial conductor interconnection wiring board mentioned above.

DESCRIPTION OF THE PREFERRED EMBODIMENTS

Figure 1:
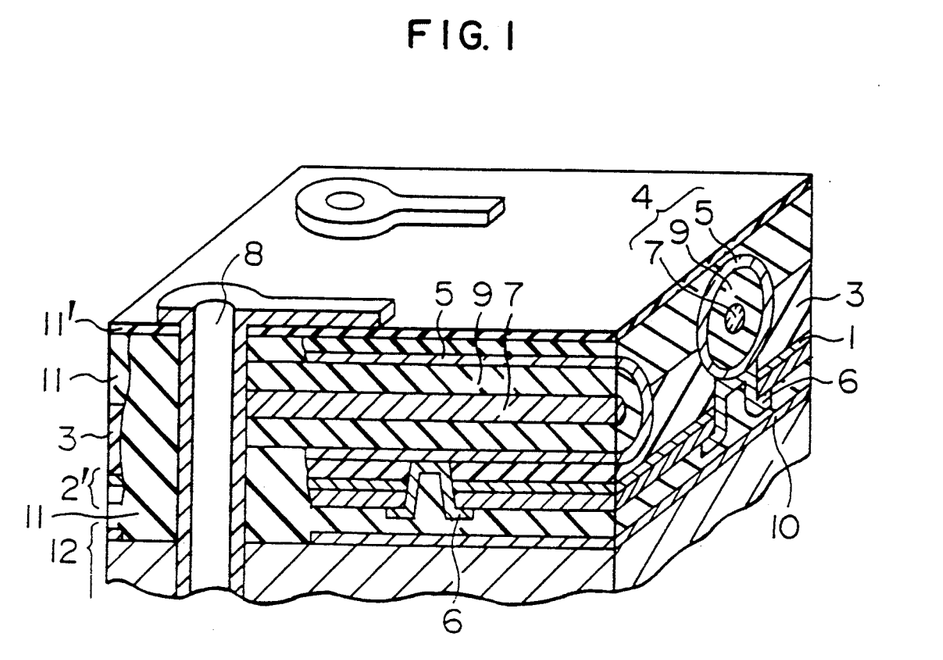
FIG. 1 is a partly cross-sectional and perspective view of one example of the wiring board of the present invention.
Figure 2:
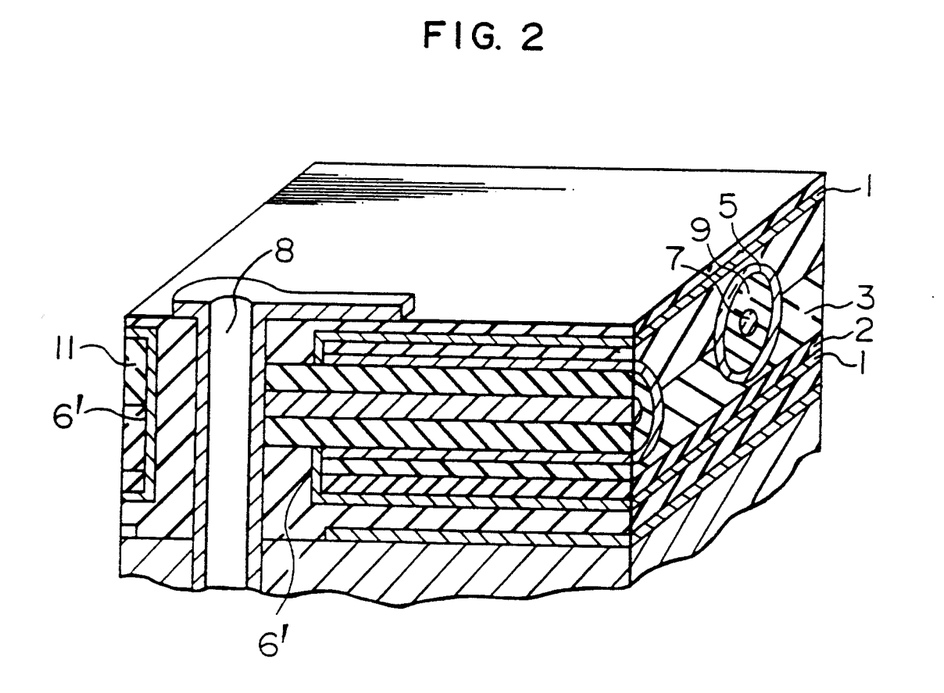
FIG. 2 is a partly cross-sectional and perspective view of another example of the wiring board of the present invention.

The coaxial conductor interconnection wiring board of the present invention referring to FIGS. 1 and 2, comprises a circuit substrate (2') having a ground layer (1), or an insulating substrate (2) formed on a ground layer (1), an adhesive insulating layer (3) formed on said circuit substrate (2') or said insulating substrate (2), at least one coaxial conductor (4) fixed on the surface of said adhesive insulating layer (3) with a desired shape, an insulating layer (11) covering said coaxial conductor (4), and at least one conductive hole (8), inner wall of which is covered with a metal film connected to a center signal conductor (7) of said coaxial conductor (4), connection of a conductive shield (5) of said coaxial conductor (4) to said ground layer (1) being obtained by at least one inner wall metallized conductive hole (6) or connection metal layers (6'), and connection of said center signal conductor (7) to said inner wall metallized conductive hole (8) being obtained by using said coaxial conductor from which a part of conductive shield (5) has been selectively removed.

One example of the wiring board of the present invention has the structure as shown in FIG. 1 (hereinafter referred to as "inner wall metallized conductive hole containing type"). Another example of the wiring board of the present invention has the structure as shown in FIG. 2 (hereinafter referred to as "connection metal layer built-in type").

The inner wall metallized conductive hole containing type wiring board has a structure as shown in FIG. 1 comprising a circuit substrate (2') having a ground layer (1), an adhesive insulating layer (3) formed on the circuit substrate (2'), at least one coaxial conductor (4) with a desired shape fixed on the surface of the adhesive insulating layer (3), at least one inner wall metallized conductive hole (6) connected to a conductive shield (5) of the coaxial conductor and the ground layer (1), and at least one inner wall metallized conductive hole (8) connected to a central signal conductor (7) of the coaxial conductor, connection of the central signal conductor (7) to the inner wall metallized conductive hole (8) being obtained by using the coaxial conductor from which a part of conductive shield (5) has been selectively removed.

Such a wiring board can be produced as follows.

Figure 3:
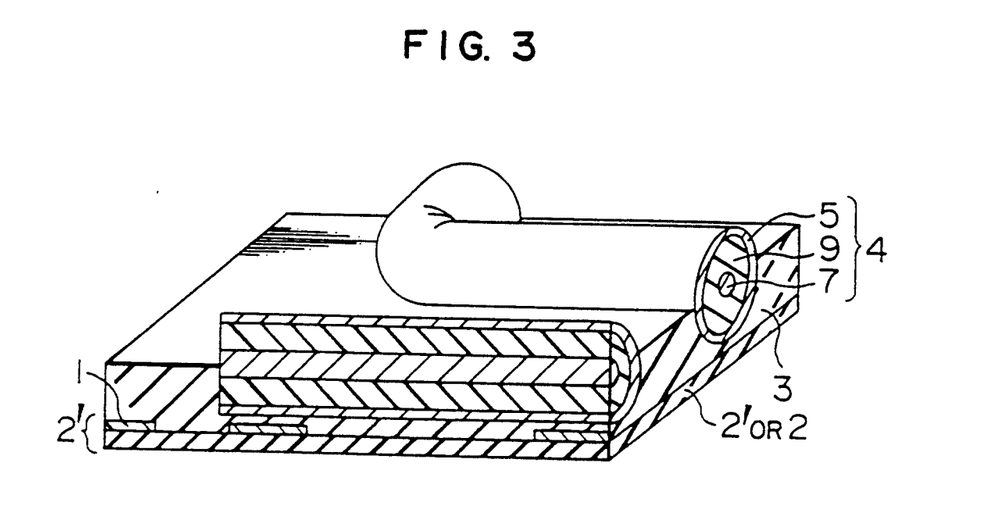
FIGS. 3 to 17 are cross-sectional and perspective views and cross-sectional views explaining the processes for producing the wiring board of the present invention.

As shown in FIG. 3, on a surface of circuit substrate (2') having a ground layer (1), an adhesive insulating layer (3) is formed and a plurality of coaxial conductors (4) are placed on the adhesive insulating layer in a desired shape, followed by fixing (Step A).

As the substrate (2') for forming the ground layer, there can be used a copper-clad laminate commercially available. It is also preferably used a polyimide film on which surfaces copper foils are formed and which is good in laser processability, a metal foil coated with a thermosetting or photocurable resin mixed with an organic filler, particulate inorganic filler, short fibrous inorganic filler, or the like, a copper-clad laminate obtained by using a resin reinforced with cloth made from an organic material such as aramide fibers (aromatic polyamide fibers), etc.

As the adhesive insulating layer (3), there can be used resin compositions which can adhere coaxial conductors thereto, for example, containing natural rubber or synthetic rubber and an epoxy resin as major components.

Figure 8:
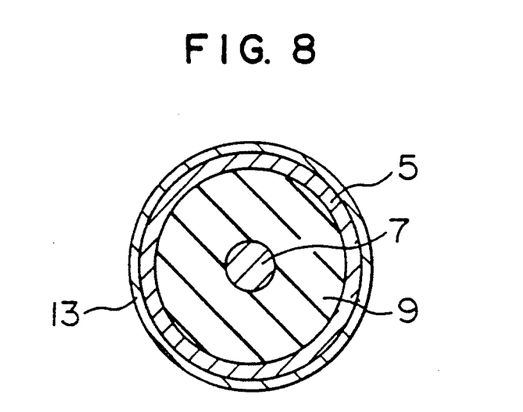

As the coaxial conductor (4), there can be used commercially available ones. In order to obtain higher density and to improve wiring workability, it is preferable to use a coaxial conductor as shown in FIG. 8 wherein numeral 5 denotes a conductive shield, numeral 7 denotes a central signal conductor, numeral 9 denotes a conductor insulating layer, and numeral 13 denotes a conductor adhesive layer excellent in adhesive strength with the adhesive insulating layer (3).

As the conductor adhesive layer (13), there can be used polyvinyl butyral/epoxy resin, nylon/phenol resin, and the like.

As the central signal conductor (7) of coaxial conductor (4), there can be used a single wire or twisted ones. The central signal conductor can have a diameter of 30 to 80 $\mu m$ and can be made of copper, a copper alloy, aluminum, an aluminum alloy, or can be a copper-clad music wire, or wires made of the materials mentioned above and plated with gold, silver, or tin.

The conductive shield (5) of coaxial conductor can be formed by plating copper or a copper alloy, or by winding a wire of 20 to 30 $\mu m$ in diameter made of copper, a copper alloy, aluminum, or an aluminum alloy or a copper-clad music wire on the surface of the conductor insulating layer (9). Further, the conductive shield (5) can be formed by winding a strip of copper or a copper alloy, or a strip of copper- or copper alloy-clad foil.

As the conductor insulating layer (9), there can be used a polyimide, a polyamideimide, a fluorine resin, a methylpentene resin, etc.

Figure 4:
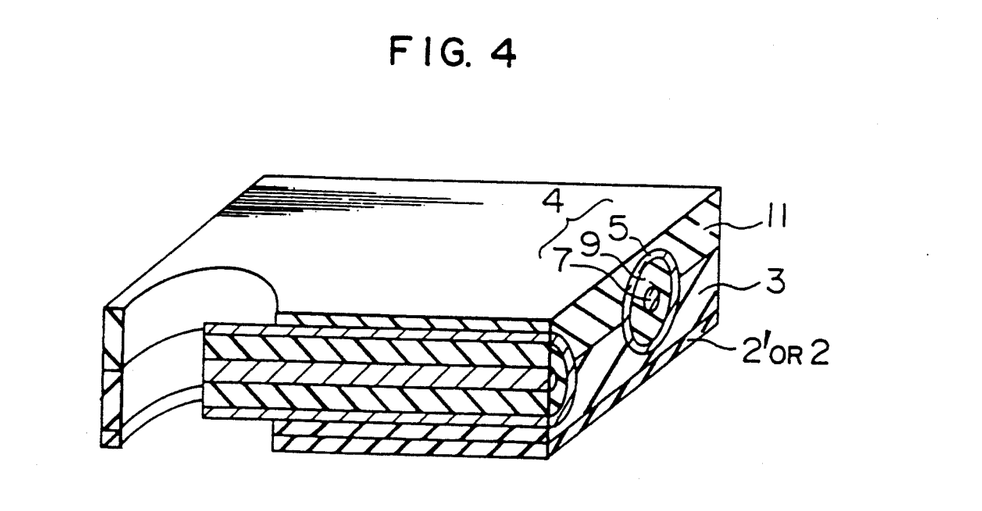

As shown in FIG. 4, an insulating layer (11) is formed so as to fix the coaxial conductors (4) (step B).

As the insulating layer (11), there can be used glass, an epoxy prepreg together with glass-epoxy prepreg, glass-polyimide prepreg, etc, these materials being formed by a press laminate method. Alternatively, the insulating layer (11) can be formed by coating an epoxy resin varnish or a polyimide varnish.

Figure 5:
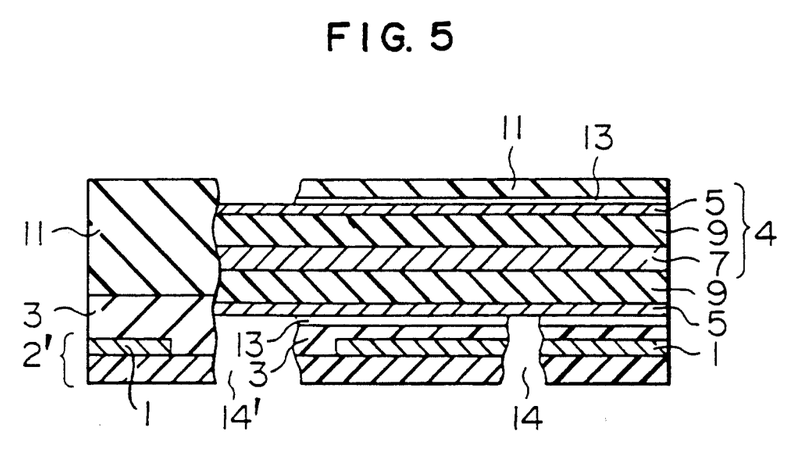

Then, as shown in FIG. 5, organic materials are removed by exposing to a laser beam to form a hole (14) wherein a conductive hole (6) for connecting the ground layer (1) to the conductive shield (5) of coaxial conductor (4) is to be formed, and to form a hole (14') wherein a conductive hole (8) for connecting the central signal conductor (7) of coaxial conductor (4) to other conductors is to be formed. In the case of forming the hole (14'), the insulating layer (11), the adhesive insulating layer (3) and the circuit substrate (2') are exposed to the laser beam to expose the conductive shield (5) (step C). In such a case, the laser beam is irradiated from the two directions, that is, from the insulating layer (11) side and from the circuit substrate (2') side in order to expose the conductive shield (5) completely.

As the laser beam, it is preferable to use $CO_2$ laser in order to easily remove the organic materials of the insulating layer (11) and the adhesive insulating layer (3) and to hardly remove the metallic layer of the conductive shield (5). It is also possible to use YAG laser, excimer laser, or the like, singly or in combination with $CO_2$ laser.

Figure 6:
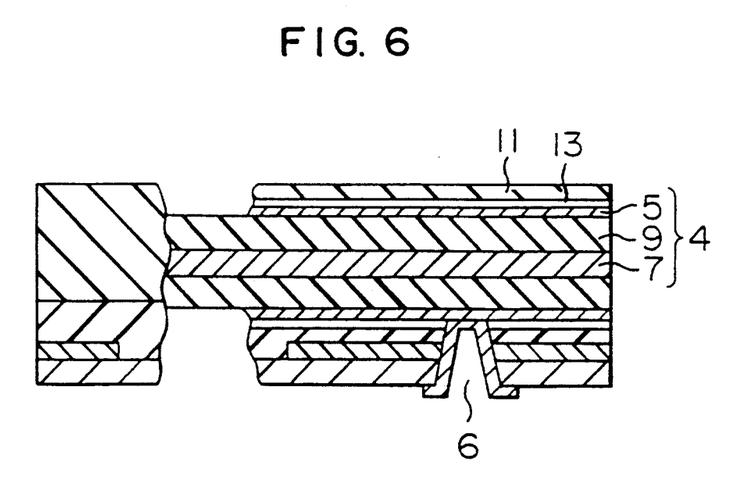

Then, as shown in FIG. 6, a metal plated layer such as a copper layer is formed on the hole (14) in FIG. 5 by an electroless metal plating or a combination of an electroless metal plating and electrolytic metal plating (step D). Then, the conductive hole (6) is formed by a conventional method. On the other hand, the conductive shield (5) of the coaxial conductor on the portion of forming the conductive hole (8) is removed by etching (step E).

Figure 7:
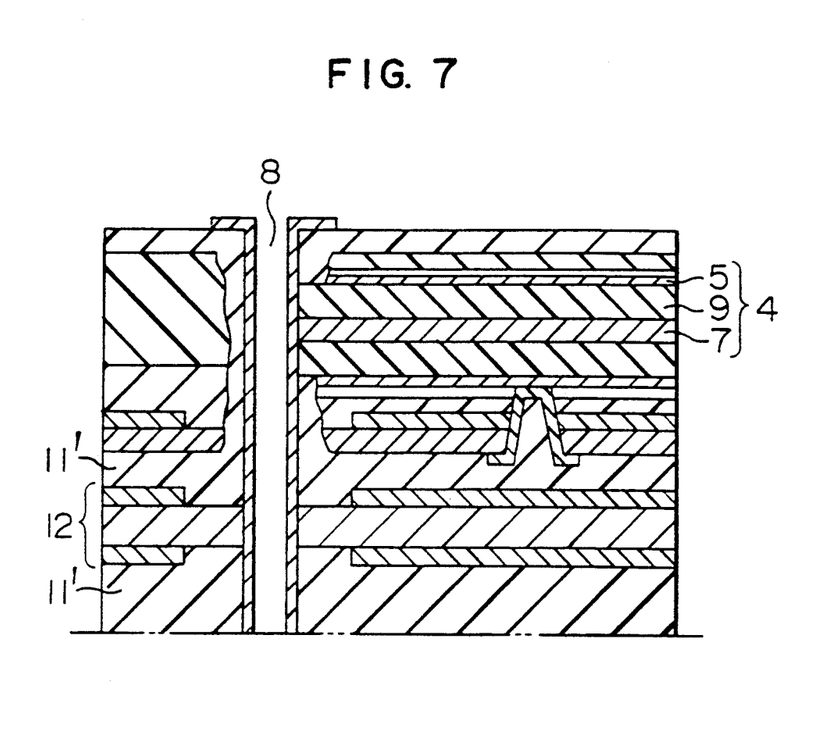

In the next place, as shown in FIG. 7, at least one substrate thus obtained and at least one inner layer plate (12) are laminated via a prepreg (11') and pressed under pressure with heating to obtain an integral structure, while the hole (14') from which the insulating material is removed is filled with a resin (step F). Then, a hole is drilled and an inner wall of the drilled hole is metallized by plating, followed by formation of the conductive hole (8) and a surface pattern by a conventional method (step G).

As the resin for filling the hole (14'), there can be used an epoxy resin, a phenolic resin, a polyimide resin, or the like.

The formation of the conductive hole (6), the conductive hole (8) and the surface pattern can be carried out by a conventional method as mentioned above. It is also possible to use an additive method.

The thus obtained wiring board does not bring about the crosstalk noise due to the use of coaxial conductors with the special connection method, and can attain high speed transmission of signal by using a material having a low dielectric constant such as polytetrafluoroethylene (TFE), tetrafluoroethylene-hexafluoropropylene copolymer (FEP), ethylene-tetrafluoroethylene copolymer (ETFE), tetrafluoroethylene-perfluoroalkyl vinylether copolymer (PFA), etc., as the conductor insulating layer (9) of coaxial conductor. Further, since the coaxial conductor is used, variations of property impedance are very small.

Further, since the method of removing the conductive shield and the conductor insulating layer together with the insulating material by the laser beam as taught by the first method disclosed in U.S. Pat. No. 4,743,710 is not employed in the present invention, the shielding effect is improved by (a) reflecting the laser beam by the conductive shield (5), retaining the conductive shield (5) and inner materials of coaxial conductor, and obtaining selective connection between the conductive shield (5) and the circuit substrate (2') by the conductive hole (6), and (b) selectively removing a part of the conductive shield (5) at the portion to be connected with other circuits of the circuit substrate (2') while not connecting with the ground layer (1), filling with the resin in the hole (14'), drilling a hole so as not to contact with the conductive shield (5) a part of which has been removed, metallizing the inner wall of the drilled hole to form the conductive hole (8) to connect to the central signal conductor (7), resulting in attaining selective connection of the conductive shield (5) and the central signal conductor (7) of the coaxial conductor.

Further, by exposing both sides of the laminate to laser beam in the formation of the hole (14), the conductive shield (5) of coaxial conductor on the portion wherein the central signal conductor (7) is to be connected is completely exposed, resulting in protecting the inner portion of the coaxial conductor under the conductive shield (5) without damage. For such a purpose, it is not preferable to use the organic electroconductive substances as disclosed in U.S. Pat. No. 4,743,710 as the conductive shield (5). In the present invention, knitted wire, copper foil or copper plated metal layer is used as the conductive shield (5).

On the other hand, the connection metal layer built-in type wiring board has a structure as shown in FIG. 2 comprising a ground layer (1), an insulating substrate (2) formed thereon, an adhesive insulating layer (3) formed on the insulating substrate (2), at least one coaxial conductor (4) with a desired shape fixed on the surface of the adhesive insulating layer (3), an insulating layer (11) covering the coaxial conductor (4), and at least one conductive hole (8) an inner wall of which is covered with a metal film connected to a central signal conductor (7) of coaxial conductor (4), the conductive shield (5) of coaxial conductor being connected to the ground layer (1) by connection metal layers (6'), the inner wall metallized conductive hole (8) being connected to the central signal conductor (7) of coaxial conductor using the coaxial conductor (4) from which a part of the conductive shield (5) has been selectively removed. As a result, the connecting portion can form a coaxial conductor structure by making the metallized hole (8) a central signal conductor, the insulating resin (11) surrounding the hole (8), and the connection metal layer (6') surrounding a part of the insulating resin.

Such a wiring board can be produced by process as shown in FIGS. 3, 4 and 9-17.

Figure 9:
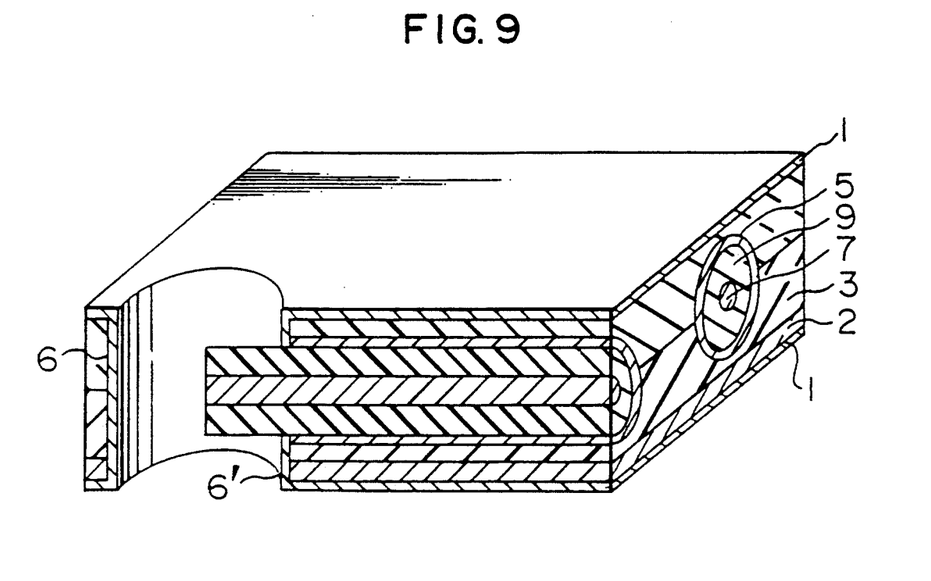
Figure 10:
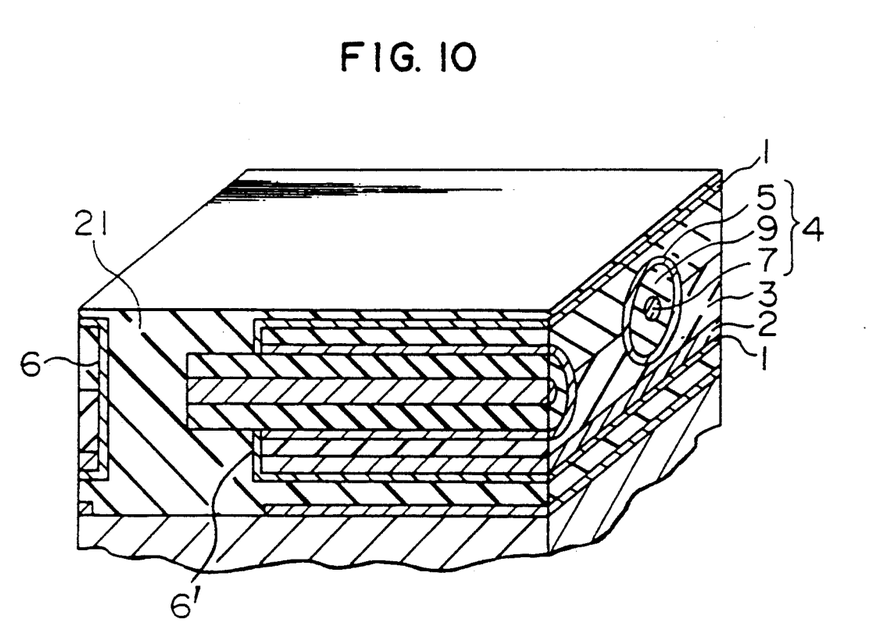
Figure 11:
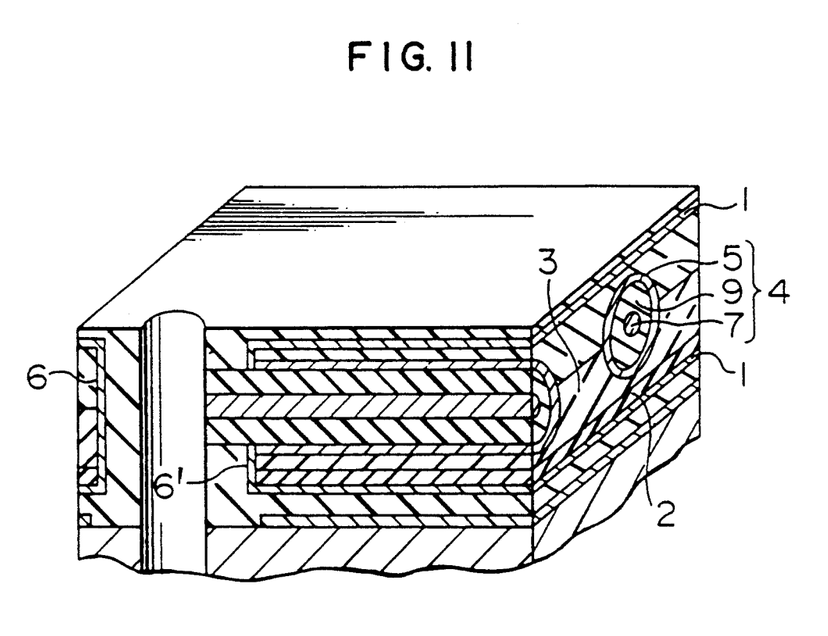
Figure 12:
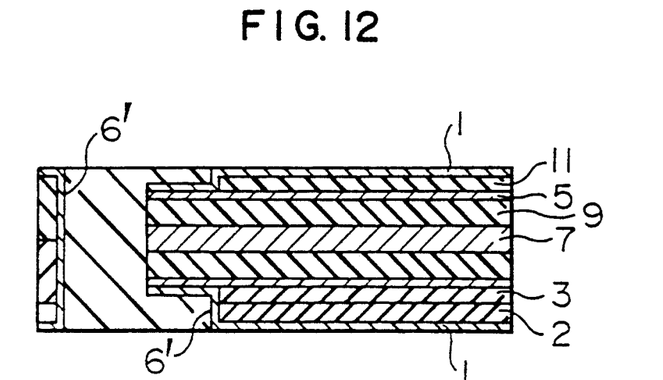
Figure 13:
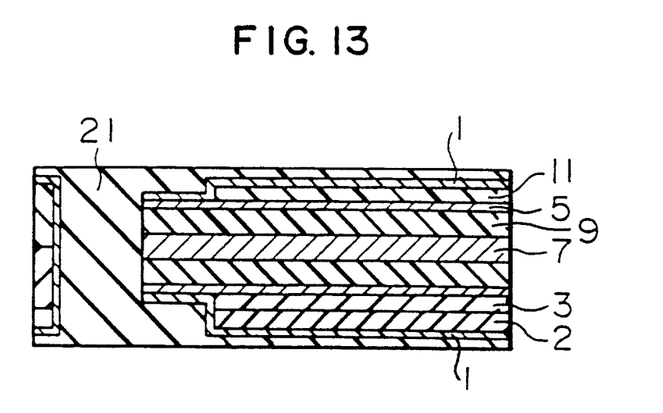
Figure 14:
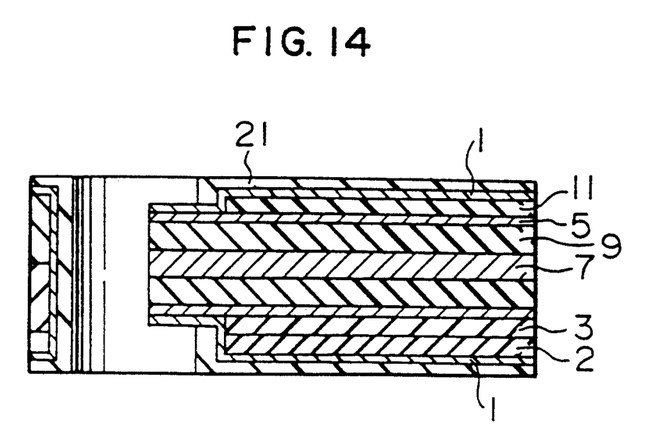
Figure 15:
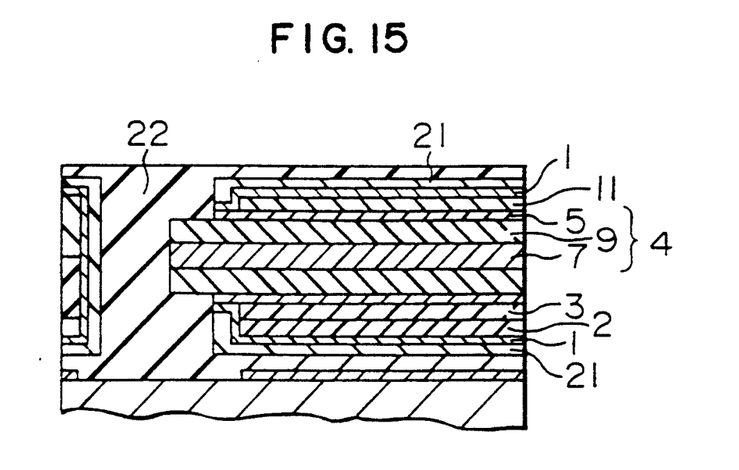
Figure 16:
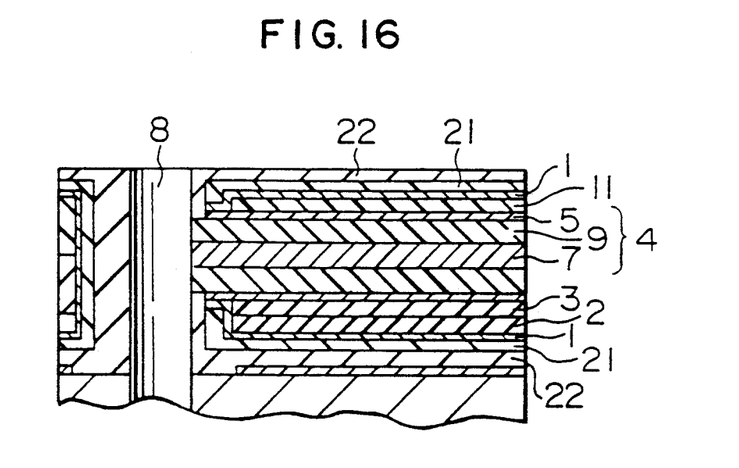
Figure 17:
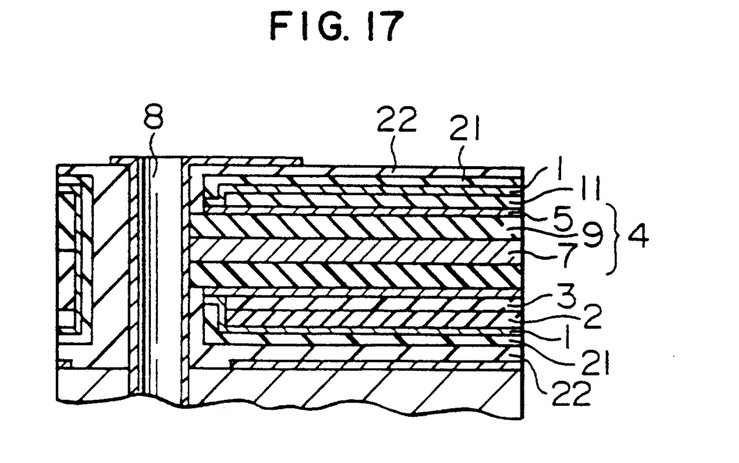

One process comprises:

(A) fixing a plurality of coaxial conductors (4) with a desired shape on the adhesive insulating layer (3) formed on the insulating substrate (2) (shown in FIG. 3), (B) forming the insulating layer (11) on the coaxial conductors (4) (not shown in a drawing), (C) exposing parts of the insulating layer (11), the adhesive insulating layer (3) and the insulating substrate (2) to laser beam so as to remove unnecessary portions for forming the connection metal layers (6') in FIG. 9 (shown in FIG. 4), (D) removing only a part of the conductive shield (5) retained by laser beam removal in the step (C) by etching (not shown in a drawing), (E) forming the connection metal layers (6') by plating on exposed conductor insulating layer (9) in the case when an adhesive layer having plating metal depositing properties is formed on the surface of the conductor insulating layer (9) (the surface of fluorine resin or polyimide being generally smooth and not plated) and exposed insulating layer (11) and adhesive insulating layer (3), and the whole surfaces of the insulating substrate (2) and the insulating layer (11) to form the ground layers (1), and for connecting at least two ground layers (1) and for connecting the conductive shield (5) of coaxial conductor to the ground layer (1) (shown in FIG. 9), (F) filling the portion removed by the laser beam with an insulating resin (21) (shown in FIG. 10), (G) drilling a hole at the portion filled with the insulating resin (21) so as to expose terminals of the central signal conductor (7) and the conductor insulating layer (9) of coaxial conductor or cross-section thereof and so as to be insulated from the conductive shield (5) of coaxial conductor and the connection metal layers (6') and the ground layer (1) formed in the step (E) (shown in FIG. 11), and (H) metallizing the inner wall of the hole drilled in the step (G) to obtain the wiring board shown in FIG. 2.

Another process for producing the wiring board of FIG. 2 comprises;

(A) fixing a plurality of coaxial conductors (4) with a desired shape on the adhesive insulating layer (3) formed on the insulating substrate (2) (shown in FIG. 3), (B) forming the insulating layer (11) on the coaxial conductors (4) (not shown in a drawing), (C) exposing parts of the insulating layer (11), the adhesive insulating layer (3) and the insulating substrate (2) to laser beam so as to remove unnecessary portions for forming the connection metal layers (6') in FIG. 9 (shown in FIG. 4), (D) forming the connection metal layers (6') by plating on exposed conductive shield (5), exposed insulating layer (11) and adhesive insulating layer (3), and the whole surfaces of the insulating substrate (2) and the insulating layer (11) to form the ground layers (1), and for connecting at least two ground layers (1) and for connecting the conductive shield (5) of coaxial conductor to the ground layer (1) (shown in FIG. 12), (E) filling the portion removed by the laser beam in the step (D) with an insulating resin. (21) (shown in FIG. 13), (F) removing a part of the insulating resin (21) by exposing to laser beam in a range narrower than the connecting portions of the connection metal layers (6') while exposing the terminal of the coaxial conductor (4) including the central signal conductor (7), the conductor insulating layer (9) and the conductive shield (5) and the ground layers formed around the coaxial conductor (4) to the resulting hole (shown in FIG. 14), (G) removing the conductive shield (5) of coaxial conductor exposed to the hole by etching (not shown in a drawing), (H) filling the portion removed by the laser beam in the step (F) with an insulating resin (22) (shown in FIG. 15), (I) drilling a hole (8) at the portion filled with the insulating resin (22) so as to expose terminals of the central signal conductor (7) and the conductive insulating layer (9) of coaxial conductor or cross-section thereof and so as to be insulated from the conductive shield (5) of coaxial conductor, and the ground layer (1) and the connection metal layers (6') formed in the step (F) (shown in FIG. 16), and (J) metallizing the inner wall of the hole drilled in the step (I) (shown in FIG. 17).

As the insulating substrate (2), there can be used commercially available ones such as an epoxy resin substrate, a phenol resin substrate, a fluorine resin substrate; cloth or paper using inorganic fibers such as glass cloth, glass paper, etc; cloth or paper using organic fibers such as cellulose, aramide, nylon fibers, polyester fibers, etc., impregnated with an epoxy resin, a phenol resin, etc. or coated with a dispersion of a fluorine resin, followed by baking; the above-mentioned resins mixed with an inorganic filler such as glass short fibers; organic polymer films such as a polyimide film, a polyester film, a polyethylene film, a polypropylene film, a polyamideimide film, a polyether ketone film, a polyetherimide film, a fluorine-containing polymer film such as polytetrafluoroethylene film, etc. It is also possible to use photocurable resins, and the resins mentioned above mixed with a catalyst for electroless plating.

As the adhesive insulating layer (3), the coaxial conductor (4), the conductor adhesive layer (13), the central signal conductor (7), the conductor insulating layer (9), and the insulating layer (11), there can be used the same materials as used in the production of the inner wall metallized conductive hole containing type wiring board.

As the laser beam, the same ones mentioned above can also be used.

As the insulating resins (21) and (22) for filling the hole removed by the laser beam, there can be used an epoxy resin, a phenol resin, a polyimide resin, etc. Preferable resins are those having the same properties as the insulating substrate (2).

The thus produced wiring board is excellent in preventing the crosstalk noise due to the use of the coaxial conductors with the special connection method. Further, since distances of connecting portion between the central signal conductor (7) and other circuits, and connecting portion between the conductive shield (7) and the ground layer (1) can be made small, influences on signals due to deviation of the designed impedance can be minimized.

Further, in the connection metal layer built-in type wiring board, since the connection metal layers (6') take a structure corresponding to the conductive shield (5) of coaxial conductor and the metallized inner wall of the conductive hole (8) take a structure corresponding to the central signal conductor (7) of coaxial conductor, the effects of using the coaxial conductor are further enhanced.

The present invention is illustrated by way of the following Examples, in which all parts and percents are by weight, unless otherwise specified.

In the following Examples, the following resin compositions were used.

Composition I

A composition was prepared by mixing 300 g of the following resins with a solution of 50 g of N-methyl-2-pyrrolidone dissolving 1 g of palladium chloride.

| | |
|---|---|
| Ethylene glycol monoethyl ether acetate (ethyl Cellosolve acetate; mfd. by Tokyo Kasei Kogyo Co., Ltd.) | 600 g/l |
| Epoxy resin (Epikote 1001, mfd. by Yuka Shell Epoxy Co., Ltd.) | 109 g/l |
| Acrylonitrile-butadiene copolymer rubber (Nitrile Rubber Nipol DN 401, mfd. by Nippon Zeon Co., Ltd.) | 20 g/l |
| Phenol resin (Hitanol 2400, mfd. by Hitachi Chemical Co., Ltd.) | 60 g/l |
| Acrylonitrile-butadiene copolymer (Nipol 1432J, mfd. by Nippon Zeon Co., Ltd.) | 144 g/l |
| Silicon dioxide powder (Crystalite VX-X, mfd. by Tatsumori K.K.) | 50 g/l |
| [Composition II] | |
| Phenoxy resin (phenotohto YP-50, mfd. by Tohto Kasei Co., Ltd.) | 100 parts |
| Methylated melamine (Melan 523, mfd. by Hitachi Chemical Co., Ltd.) | 15 parts |
| Glass short fibers (AGP-01BZ, mfd. by Asahi-Schwebel Co., Ltd.) | 35 parts |
| m-Bromobenzoic acid (mfd. by Wako Pure Chemical Industries, Ltd.) | 0.3 part |
| Palladium catalyst for electroless plating (Cat. #11, mfd. by Hitachi Chemical Co., Ltd.) | 2.5 part |
| Ethyl Cellosolve acetate (mfd. by Tokyo Kasei Kogyo Co., Ltd.) | 220 parts |
| [Composition III] | |
| Phenoxy resin (Phenotohto YP-50, mfd. by Tohto Kasei Co., Ltd.) | 70 parts |
| Epoxy resin (Epikote 828, mfd. by Yuka Shell Epoxy Co., Ltd.) | 20 parts |
| Epoxy resin (DEN 438, mfd. by Dow Chemical Co.) | 10 parts |
| Polyvinyl butyral resin (Eslex BM-2, mfd. by Sekisui Chemical Co., Ltd.) | 20 parts |
| Methylated melamine (Melan 523, mfd. by Hitachi Chemical Co., Ltd.) | 20 parts |
| Imidazole derivative (2PZ-CNS, mfd. by Shikoku Kasei Co., Ltd.) | 2 parts |
| Silicon dioxide powder (Crystalite VX-X, mfd. by Tatsumori K.K.) | 20 parts |
| Ethyl Cellosolve acetate (mfd. by Tokyo Kasei Kogyo Co., Ltd.) | 200 parts |

Example 1

An etching resist was formed on desired portions of both surfaces of double-sided roughened copper-clad glass polyimide laminate (MCL-1-67, a trade name, mfd. by Hitachi Chemical Co., Ltd.) and unnecessary copper foil on the portions to be formed into conductive holes (6) and (8) was removed by etching to prepare a circuit substrate (2') having a ground layer (1) (see FIG. 1). A dry film of 100 μm thick was prepared from Composition I and laminated on a surface of the circuit substrate (2') under press conditions of 150° C., and 10 kg/cm² for 10 minutes. Coaxial conductors having an outer diameter of 0.22 mm, a diameter of the central signal conductor of 0.075 mm, the thickness of the conductive shield of 0.01 mm, and the conductor insulating layer made from a fluorine resin were wired in the desired pattern according to a wiring rule so as to make the wiring density 2 wires/2.54 mm and the wire pitch 0.45 mm using a numerical controlling wiring machine.

Then, a dry film of 180 μm thick made from Composition II was laminated on the coaxial conductor positioned surface and pressed at 150° C. and 10 kg/cm² for 10 minutes, followed by pressing with heating at 170° C. and 30 kg/cm² for 90 minutes to obtain an integrated structure.

Focussed $CO_2$ laser beam having a spot diameter of 200 μm was irradiated with an output of 45 W on a portion of the resulting substrate to be formed into a conductive hole (6). The hole (6) was to be plated in a later step so as to be connected to the ground layer. The size of the hole (6) should be sufficiently large for the connection and for fully contacting with a plating solution, and usually 0.5 to 1.0 mm in diameter. Such a hole was formed by irradiating the laser beam while scanning. In this Example, the hole diameter was 0.5 mm. Further, focussed $CO_2$ laser beam having a spot diameter 200 μm was irradiated on a portion of the resulting substrate to be formed into a conductive hole (8). The hole (8) was formed so as to remove the conductive shield (5) of coaxial conductor in a later step. Thus, the hole (8) should be formed so as not to contact with a hole formed in a later step for connecting to the central signal conductor (7), even if working error takes place. In this Example, the hole (8) was formed in the same manner as forming the hole (6) so as to make the diameter 1.7 mm using the laser beam while scanning.

The resulting substrate was washed, provided with a catalyst for electroless plating, accelerated in adhesion, and dipped in an electroless copper plating solution (Hid-410, a trade name, mfd. by Hitachi Chemical Co., Ltd.) for 10 hours to form a copper plated layer of 25 μm thick. Then, an etching resist was formed only on the portion to be formed into a conductive hole (6) to remove unnecessary copper plated layer by etching.

The resulting substrate, an inner layer made by an etched foil method, a glass-polyimide prepreg (GIA-67N, a trade name mfd. by Hitachi Chemical Co., Ltd.) and a copper foil were piled and pressed at 180° C. and 30 kg/cm² for 90 minutes to obtain an integrated structure. As a result, the hole (8) was filled with the polyimide resin contained in the glass-polyimide prepreg. On desired portions of the resulting substrate, holes of 0.8 mm in diameter were drilled, washed, provided with a catalyst for electroless plating, accelerated in adhesion and subjected to electroless copper plating to form electroless copper plated layers of about 35 μm on the inner wall of the hole and the surface of copper foil. Etching resists were formed on necessary portions such as pads and terminals for mounting electronic parts to remove unnecessary copper by etching. As a result, a wiring board as shown in FIG. 1 was obtained.

Example 2

On a double-sided roughened copper foil, Composition III was coated to form a film of 100 μm thick, followed by heating at 120° C. for 30 minutes, and 160° C. for 30 minutes. Then, an etching resist was formed on the resulting film, followed by removal of copper foils from the portions to be formed into conductive holes (6) and (8) to prepare a circuit substrate having a ground layer thereon.

A dry film of 100 μm thick was formed from Composition I, and laminated on the copper foil surface of the circuit substrate under press conditions of 150° C. and 10 kg/cm² for 10 minutes. The same coaxial conductors as used in Example 1 except for covered with epoxy resin/nylon adhesive layer of 10 μm thick were wired in the desired pattern according to a wiring rule so as to make the wiring density 2 wires/2.54 mm and the wire pitch 0.45 mm using a numerical value controlling wiring machine.

Then, using the same procedure as used in Example 1, a wiring board as shown in FIG. 1 was produced.

Example 3

A circuit substrate having a ground layer was prepared by impregrating aramide fibers with Composition III, half-curing the impregnated aramide fibers, laying surface roughened double-sided copper foils of 35 μm thick on a side thereof, pressing at 160° C. and 30 kg/cm² for 60 minutes to obtain an integrated structure, forming etching resists on surfaces of the resulting substrate and removing copper foils on the portions to be formed into conductive holes (6) and (8) by etching.

Then, using the same procedure as used in Example 1, a wiring board as shown in FIG. 1 was produced.

Example 4

The process of Example 1 was repeated except for using coaxial conductors having an outer diameter of 0.18 mm, a central signal conductor with a diameter of 0.06 mm, a conductive shield of 0.01 mm thick, and a conductor insulating layer made from a polyimide resin.

The wiring boards produced in Examples 1 to 4 showed no crosstalk noise when measured under the following conditions:

| | |
|---|---|
| Distance between conductors: | 0.4 mm |
| Length of conductors positioned in parallel: | 30 cm |
| Induction pulse potential: | 5 V |
| Induction pulse width: | 500 ns |
| Induction pulse rise time: | 1 ns |

On the other hand, when signal conductors having conductor insulating layers but having no conductive shield were used, the resulting wiring board showed the crosstalk noise of 4 to 4.5%.

This shows great effects of the wiring boards of the present invention.

Example 5

A glass-polyimide insulating plate of 0.2 mm thick and cured completely was prepared.

A dry film of 100 μm thick was made from Composition I and laminated on a surface of the substrate by pressing at 150° C. and 10 kg/cm² for 10 minutes. Then, coaxial conductors having an outer diameter of 0.22 mm, a diameter of the central signal conductor of 0.075 mm, the thickness of the conductive shield of 0.01 mm, and the conductor insulating layer made from a fluorine resin (the surface of the conductor insulating layer (9) being smooth, and thus not plated) were wired in the desired pattern according to a wiring rule so as to make the wiring density 2 wires/2.54 mm and the wire pitch 0.4 mm using a numerical value controlling wiring machine.

Then, a dry film of 180 μm thick made from Composition II was laminated on the coaxial conductor positioned surface and pressed at 150° C. and 10 kg/cm² for 10 minutes, followed by pressing with heating at 170° C. and 30 kg/cm² for 90 minutes to obtain an integrated structure.

Focussed $CO_2$ laser beam having a spot diameter of 200 μm was irradiated with an output of 45 W on a portion of the resulting substrate to be formed into a connection metal layer to remove the resin so as to make a hole diameter 2 mm and so as to expose the conductive shield of coaxial conductor when viewed from both sides of the substrate. Then, the exposed conductive shield was removed by etching using a cupric chloride solution.

The resulting substrate was washed, provided with a catalyst for electroless plating, accelerated in adhesion, and dipped in an electroless copper plating solution (Hid-410, a trade name, mfd. by Hitachi Chemical Co., Ltd.) for 10 hours to form a copper plated layer of 25 μm thick. No copper plating was deposited on the conductor insulating layer of coaxial conductor at this time.

The resulting substrate, an inner plate prepared by an etched foil method, a glass-polyimide-made prepreg (GIA-67N, a trade name, mfd. by Hitachi Chemical Co., Ltd.) and a copper foil were laminated and pressed at 180° C. and 30 kg/cm² for 90 minutes to obtain an integrated structure. As a result, the hole was filled with the polyimide resin contained in the glass-polyimide prepreg. Then, desired portions of the resulting substrate and the portions from which the condutive shield had been removed and not contacted with the above-mentioned conductive shield were drilled to form holes of 0.8 mm in diameter, followed by washing, providing with a catalyst for electroless plating, accelerating in adhesion and conducting electroless copper plating to form copper plated layers of about 35 μm thick on inner wall of the hole and the surface of copper foil. Etching resists were formed on necessary portions such as pads and terminals for mounting electronic parts to remove unnecessary copper by etching to produce a wiring board as shown in FIG. 2.

Example 6

A glass-polyimide insulating plate of 0.2 mm thick and cured completely was prepared.

A dry film of 100 μm thick was made from Composition I and laminated on a surface of the circuit substrate by pressing at 150° C. and 10 kg/cm² for 10 minutes. Then, coaxial conductors having an outer diameter of 0.22 mm, a diameter of the central signal conductor of 0.075 mm, the thickness of the conductive shield of 0.01 mm, the conductor insulating layer made from a fluorine resin, the conductor insulating layer being covered with as adhesive resin an epoxy resin layer mixed with aluminum silicate adsorbing palladium which is a catalyst for plating, the epoxy resin layer being covered with a copper film obtained by electroless plating as a conductive shield, were wired in the desired pattern according to a wiring rule so as to make the wiring density 2 wires/2.54 mm and the wire pitch 0.4 mm using a numerical value controlling wiring machine.

Then, a dry film of 180 μm thick made from Composition II was laminated on the coaxial conductor positioned surface and pressed at 150° C. and 10 kg/cm² for 10 minutes, followed by pressing with heating at 170° C. and 30 kg/cm² for 90 minutes to obtain an integrated structure.

Focussed $CO_2$ laser beam having a spot diameter of 200 μm was irradiated with an output of 45 W on a portion of the resulting substrate to be formed into a connection metal layer to remove the resin so as to make a hole diameter 4 mm and so as to expose the conductive shield of coaxial conductor when viewed from both sides of the substrate.

The resulting substrate was washed, provided with a catalyst for electroless plating, accelerated in adhesion, and dipped in an electroless copper plating solution (Hid-410, a trade name, mfd. by Hitachi Chemical Co., Ltd.) for 10 hours to form a copper plated layer of 25 μm thick.

Then, Composition III was coated on surfaces of the substrate and the portion removed by the laser, followed by curing of the resin by sandwiching with a pair of stainless steel plates at 170° C. and 30 kg/cm² for 90 minutes.

Further, the portion to be formed into a connection metal layer was exposed to $CO_2$ laser of which spot diameter was focussed to 200 μm with an output of 45 W to remove the resin so as to make the hole diameter 2 mm, resulting in exposing the conductive shield of coaxial conductor so that the exposed conductive shield was able to be seen from the both sides of the substrate.

Then, the exposed conductive shield was removed by etching using an aqueous solution of cupric chloride.

In the next place, Composition III was coated on surfaces of the substrate and the portion removed by the laser, followed by curing of the resin by sandwiching with a pair of stainless steel plates at 170° C. and 30 kg/cm² for 90 minutes.

The resulting substrate, an inner plate prepared by an etched foil method, a glass-polyimide-made prepreg (GIA-67N, a trade name, mfd. by Hitachi Chemical Co., Ltd.) and a copper foil were laminated and pressed at 180° C. and 30 kg/cm² for 90 minutes to obtain an integrated structure. Then, desired portions of the resulting substrate and the portions from which the conductive shield had been removed and not contacted with the above-mentioned conductive shield were drilled to form holes of 0.8 mm in diameter, followed by washing, providing with a catalyst for electroless plating, accelerating in adhesion, and conducting electroless copper plating to form copper plated layers of about 35 μm thick on inner wall of the hole and the surface of copper foil. Etching resists were formed on necessary portions such as pads and terminals for mounting electronic parts to remove unnecessary copper by etching to produce a wiring board (not shown in a drawing).

The wiring boards produced in Examples 5 and 6 showed no crosstalk noise when measured under the following conditions:

| | |
|---|---|
| Distance between conductors: | 0.4 mm |
| Length of conductors positioned in parallel: | 30 cm |
| Induction pulse potential: | 5 V |
| Induction pulse width: | 500 ns |

-continued

| Induction pulse rise time: | 1 ns |

On the other hand, when a land on the surface of wiring board connected to the central signal conductor of coaxial conductor, and a land formed on very near place thereof and connected to the ground layer were terminated with a resistance of 50 ohms, distance of wave form by reflection was not generated nor observed.

As explained above, the wiring board excellent in controlling the crosstalk noise and controlling the interference by reflection can easy be obtained and effectively be produced according to the present invention.

What is claimed is:

1. A process for producing a coaxial conductor interconnection wiring board including a circuit substrate having a ground layer, an adhesive insulating layer formed on the circuit substrate, at least one coaxial conductor with a desired shape fixed on the surface of the adhesive insulating layer, at least one inner wall metallized conductive hole connected to a conductive shield of the coaxial conductor and the ground layer, and at least one inner wall metallized conductive hole connected to a central signal conductor of the coaxial conductor, connection of the central signal conductor to the inner wall metallized conductive hole being obtained by using the coaxial conductor from which a part of conductive shield has been removed selectively, the process comprising the steps of:

fixing a plurality of coaxial conductors with a desired form on an adhesive insulating layer formed on a surface of a circuit substrate having a ground layer, forming an insulating layer on the coaxial conductors, removing a portion of the circuit substrate having the ground layer thereon and the adhesive insulating layer to form a conductive hole for connecting the ground layer to a conductive shield of a coaxial conductor of the coaxial conductors, and removing an additional portion of the insulating layer, the circuit substrate having the ground layer thereon and the adhesive insulating layer to expose the conductive shield of the coaxial conductor and to form a conductive hole for connecting the center signal conductor of the coaxial conductor to additional circuits, by irradiating laser beam, metallizing an inner wall of the conductive hole for connecting the ground layer to the conductive shield of the coaxial conductor, selectively removing the exposed conductive shield of coaxial conductor in the conductive hole for connecting the central signal conductor of the coaxial conductor to the additional circuits by etching, integrating the resulting substrate, the insulating layer and an inner plate, and filling the portion to be formed into the conductive hole for connecting the central signal conductor to the additional circuits and from which the portion of the insulating material has been removed with a resin, and drilling a hole filled with the resin, and metallizing an inner wall of the hole which connects the central signal conductor to the additional circuits, wherein in the removing step, the laser beams are irradiated from a side of the insulating layer and from a side of the circuit substrate to substantially expose the conductive shield of coaxial conductor.

2. A process according to claim 1, wherein the conductive shield of coaxial conductor is made of a wound wire of copper, a copper foil or a copper layer obtained by plating.

3. A process according to claim 1, wherein the coaxial conductor has an adhesive layer on the conductive shield.

4. A process according to claim 1, wherein the insulating layer and the adhesive insulating layer are made from a thermosetting resin or a photocurable resin containing an organic cloth, an organic filler, an inorganic particulate filler or an inorganic short-fiber filler.

5. A process for producing a coaxial conductor interconnection wiring board comprising the steps of:

fixing a plurality of coaxial conductors with a desired shape on an adhesive insulating layer formed on an insulating substrate, forming an insulating layer on the coaxial conductors, exposing portions of the insulating layer, the adhesive insulating layer and the insulating substrate to a laser beam so as to remove unnecessary portions for forming connection metal layers, removing only a portion of a conductive shield of the coaxial conductors retained by said laser beam in the exposing step by etching, forming the connection metal layers by plating on said exposed insulating substrate, and exposed insulating layer and adhesive insulating layer, and the entire surfaces of the insulating substrate and the insulating layer to form ground layers, and for connecting at least two of the ground layers, and for connecting the conductive shield of the coaxial conductor to the ground layer, filling the unnecessary portions removed by the laser beam with an insulating resin, drilling a hole in the insulating resin to expose a terminal of a central signal conductor and a conductor insulating layer of the coaxial conductors or a cross-section thereof and to be insulated from the conductive shield and the connection metal layers and the ground layer formed in the step of forming the connection metal layers, and metallizing an inner wall of the hole drilled in the drilling step.

6. A process for producing a coaxial conductor interconnection wiring board comprising the steps of:

fixing a plurality of coaxial conductors with a desired shape on an adhesive insulating layer formed on an insulating substrate, forming an insulating layer on the coaxial conductors, exposing portions of the insulating layer, the adhesive insulating layer and the insulating substrate to a laser beam to remove unnecessary portions for forming connection metal layers, forming the connection metal layers by plating to an exposed conductive shield of a coaxial conductor, the exposed insulating layer and the adhesive insulating layer, and the entire surfaces of the insulating substrate and the insulating layer to form ground layers, and for connecting at least two of the ground layers and for connecting the conductive shield of the coaxial conductor to the ground layers, filling the unnecessary portions removed by the laser beam with an insulating resin, removing a portion of the insulating resin by exposing to the laser beam in a range narrower than connecting portions of the connection metal layers by forming a hole while exposing a terminal of the coaxial conductor including a central signal conductor, a conductor insulating layer and the conductive shield and the ground layers formed around the coaxial conductor to the resulting hole, removing the conductive shield of the coaxial conductor exposed to the hole by etching, filling the unnecessary portions removed by the laser beam with another insulating resin, drilling an additional hole at a portion filled with the other insulating resin to expose terminals of the central signal conductor and the conductor insulating layer of coaxial conductor or cross-section thereof and to be insulated from the conductive shield of coaxial conductor, and the ground layer and the connection metal layers formed in the step of removing the portion of the insulating resin, and metallizing an inner wall of the additional hole drilled in the drilling step.

* * * * *

UNITED STATES PATENT AND TRADEMARK OFFICE
CERTIFICATE OF CORRECTION

PATENT NO. : 5,323,534
DATED : June 28, 1994
INVENTOR(S) : Iwasaki et al.

It is certified that error appears in the above-indentified patent and that said Letters Patent is hereby corrected as shown below:

Title page of the patent, in item [73] (Assignee), delete "Hitachi, Ltd., Tokyo, Japan" insert --Hitachi Chemical Company, Ltd., Tokyo, Japan--.

Signed and Sealed this

Eighth Day of February, 2000

*Attest:*

Q. TODD DICKINSON

*Attesting Officer*     *Commissioner of Patents and Trademarks*